(12) United States Patent
Kim et al.

(10) Patent No.: US 11,539,015 B2
(45) Date of Patent: Dec. 27, 2022

(54) ELECTROLUMINESCENT DEVICE, AND DISPLAY DEVICE COMPRISING THE SAME

(71) Applicant: SAMSUNG ELECTRONICS CO., LTD., Suwon-si (KR)

(72) Inventors: Tae Ho Kim, Seongnam-si (KR); Sung Woo Kim, Hwaseong-si (KR); Eun Joo Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 189 days.

(21) Appl. No.: 17/132,971

(22) Filed: Dec. 23, 2020

(65) Prior Publication Data

US 2021/0119164 A1    Apr. 22, 2021

Related U.S. Application Data

(63) Continuation of application No. 16/299,944, filed on Mar. 12, 2019, now Pat. No. 10,879,484.

(30) Foreign Application Priority Data

Mar. 12, 2018 (KR) .................. 10-2018-0028836

(51) Int. Cl.
*H01L 51/50* (2006.01)
*H01L 51/00* (2006.01)
*H01L 27/32* (2006.01)

(52) U.S. Cl.
CPC ........ *H01L 51/508* (2013.01); *H01L 51/0052* (2013.01); *H01L 51/0067* (2013.01);
(Continued)

(58) Field of Classification Search
CPC .............. H01L 51/508; H01L 51/0052; H01L 51/0067; H01L 51/0072; H01L 51/5004;
(Continued)

(56) References Cited

U.S. PATENT DOCUMENTS 6,023,073 A    2/2000   Strite
9,054,330 B2   6/2015   Qian et al.
(Continued)

FOREIGN PATENT DOCUMENTS

KR    1626525 B1    6/2016
KR    1686107 B1    12/2016
(Continued)

OTHER PUBLICATIONS

Extended European Search Report dated Jul. 26, 2019, of the corresponding European Patent Application No. 19162326.3.

*Primary Examiner* — Nilufa Rahim

(74) *Attorney, Agent, or Firm* — Cantor Colburn LLP

(57) ABSTRACT

An electroluminescent device comprising a first electrode and a second electrode facing each other, an emission layer disposed between the first electrode and the second electrode and including at least two light emitting particles, a hole transport layer disposed between the first electrode and the emission layer, and an electron transport layer disposed between the emission layer and the second electrode, wherein the electron transport layer comprises an inorganic layer disposed on the emission layer, the inorganic layer comprising a plurality of inorganic nanoparticles; and an organic layer directly disposed on at least a portion of the inorganic layer on a side opposite the emission layer, wherein a work function of the organic layer is greater than a work function of the inorganic layer.

20 Claims, 14 Drawing Sheets

(52) U.S. Cl.
CPC ........ *H01L 51/0072* (2013.01); *H01L 51/502* (2013.01); *H01L 51/5004* (2013.01); *H01L 27/32* (2013.01); *H01L 2251/303* (2013.01); *H01L 2251/5369* (2013.01); *H01L 2251/552* (2013.01)

(58) Field of Classification Search
CPC ... H01L 51/502; H01L 51/0032; H01L 51/56; H01L 27/32; H01L 2251/303; H01L 2251/5369; H01L 2251/552
See application file for complete search history.

(56) References Cited

U.S. PATENT DOCUMENTS

| | | |
|---|---|---|
| 2011/0284831 A1* | 11/2011 | Kaiser .................... C09B 57/00 257/40 |
| 2013/0009131 A1 | 1/2013 | Kazlas et al. |
| 2014/0084280 A1 | 3/2014 | Chiba et al. |
| 2014/0353596 A1 | 12/2014 | Kim et al. |
| 2015/0299562 A1 | 10/2015 | Buchholz et al. |
| 2016/0301025 A1 | 10/2016 | Bai et al. |
| 2017/0092888 A1 | 3/2017 | Han et al. |
| 2017/0221969 A1 | 8/2017 | Steckel et al. |

FOREIGN PATENT DOCUMENTS

| | | |
|---|---|---|
| KR | 1686808 B1 | 12/2016 |
| WO | 2012161179 A1 | 11/2012 |

* cited by examiner

ELECTROLUMINESCENT DEVICE, AND DISPLAY DEVICE COMPRISING THE SAME

CROSS-REFERENCE TO RELATED APPLICATION

This application is a Continuation of U.S. application Ser. No. 16/299,944, filed on Mar. 12, 2019 and now issued as U.S. Pat. No. 10,879,484, and claims priority to and the benefit of Korean Patent Application No. 10-2018-0028836 filed in the Korean Intellectual Property Office on Mar. 12, 2018, and all the benefits accruing therefrom under 35 U.S.C. § 119, the entire contents of which are incorporated herein by reference.

BACKGROUND

1. Field

An electroluminescent device and a display device comprising thereof are disclosed.

2. Description of the Related Art

Quantum dots are a nanocrystal semiconductor material having a diameter of about several to several hundreds of nanometers (nm) that provides a large surface area per unit volume, and exhibit quantum confinement effects. Quantum dots generate stronger light in a narrower wavelength region than the commonly used phosphor. Quantum dots emit light while the excited electrons are transited from a conduction band to a valence band and wavelengths are changed depending upon a particle size, even within the same material. The quantum dot particle sizes can be selected to obtain light in a desirable wavelength region.

In other words, the emission layer including quantum dots, and the various types of electronic devices including the same, may generally reduce production cost, compared to the use of organic light emitting diodes having an emission layer including a phosphorescence and/or phosphor material. In addition, a desirable color may be emitted by changing sizes of quantum dots, rather than having to use other organic materials in the emission layer for emitting other colors of light.

The luminous efficiency of the emission layer including quantum dots is determined by the external quantum efficiency (EQE) of quantum dots, which is determined based on a balance of charge carriers, light extraction efficiency, and the like. Accordingly, when an emission layer including a quantum dot is applied as an electro-luminescence layer, improving the luminous efficiency of the emission layer requires adjusting the balance of charge carriers and light extraction efficiency, together with reducing current leakage that can be associated with the use of various charge carrier layers.

SUMMARY

An electroluminescent device capable of minimizing a leakage current while improving a charge carrier balance and light extraction efficiency of an emission layer is provided.

According to an embodiment, an electroluminescent device includes a first electrode and a second electrode facing each other; an emission layer disposed between the first electrode and the second electrode and including at least two light emitting particles; a hole transport layer disposed between the first electrode and the emission layer; and an electron transport layer disposed between the emission layer and the second electrode, wherein the electron transport layer includes an inorganic layer disposed on the emission layer, the inorganic layer comprising a plurality of inorganic nanoparticles; and an organic layer directly disposed on at least a portion of the inorganic layer on a side opposite the emission layer, wherein a work function of the organic layer is greater than a work function of the inorganic layer.

The organic layer may completely cover an upper surface of the inorganic layer between the inorganic layer and the second electrode.

The organic layer may have a lowest unoccupied molecular orbital (LUMO) energy level of about −1.8 electron Volts (eV) to about −2.8 eV.

The organic layer may have an electron mobility of about $10^{-3}$ square centimeters per Volt-second ($cm^2/V \cdot s$) to about $10^{-1}$ $cm^2/V \cdot s$.

An inorganic nanoparticle of the plurality of inorganic nanoparticles can be ZnO, $TiO_2$, $ZrO_2$, $SnO_2$, $WO_3$, $Ta_2O_3$, or a combination thereof.

An average particle diameter of the plurality of inorganic nanoparticles may be less than or equal to about 150 nanometers (nm).

The inorganic layer may be disposed on the emission layer as a cluster layer comprising the plurality of the inorganic nanoparticles.

The cluster layer may be disposed directly on the emission layer. The upper surface of the cluster layer may include a surface region having two or more grains each comprising the inorganic nanoparticles, wherein a grain boundary is formed between adjacent grains, and the organic layer may fill at least a portion of the grain boundary.

The organic layer may include an organic semiconductor compound that is a quinolone-based compound, a triazine-based compound, a quinoline-based compound, a triazole-based compound, a naphthalene-based compound, or a combination thereof.

The organic layer may include at least two different organic semiconductor compounds.

The organic layer may include a first organic semiconductor compound and a second organic semiconductor compound that are different from each other and a weight ratio of the first organic semiconductor compound and the second organic semiconductor compound in the organic layer may be about 3:7 to about 7:3.

An average thickness of the organic layer may be about 2 nm to about 20 nm.

The electron transport layer may further include at least one additional unit comprising a second inorganic layer and a second organic layer, wherein the at least one additional unit may be alternately stacked.

The plurality of light emitting particles may include quantum dots. The quantum dots may be a Group II-VI compound that does not include Cd, a Group III-V compound, a Group IV-VI compound, a Group IV element or compound, a Group compound, a Group I-II-IV-VI compound that does not include Cd, or a combination thereof.

The quantum dots may have a core-shell structure.

The electron transport layer may not have electroluminescence.

According to another embodiment, a display device includes the electroluminescent device.

An electroluminescent device having driving characteristics and life-span characteristics by improving a charge carrier balance and light extraction efficiency of an emission layer and simultaneously minimizing a leakage current and a display device including the same may be provided.

BRIEF DESCRIPTION OF THE DRAWINGS

These and/or other aspects will become apparent and more readily appreciated from the following description of the embodiments, taken in conjunction with the accompanying drawing, in which.

DETAILED DESCRIPTION

Figure 1:
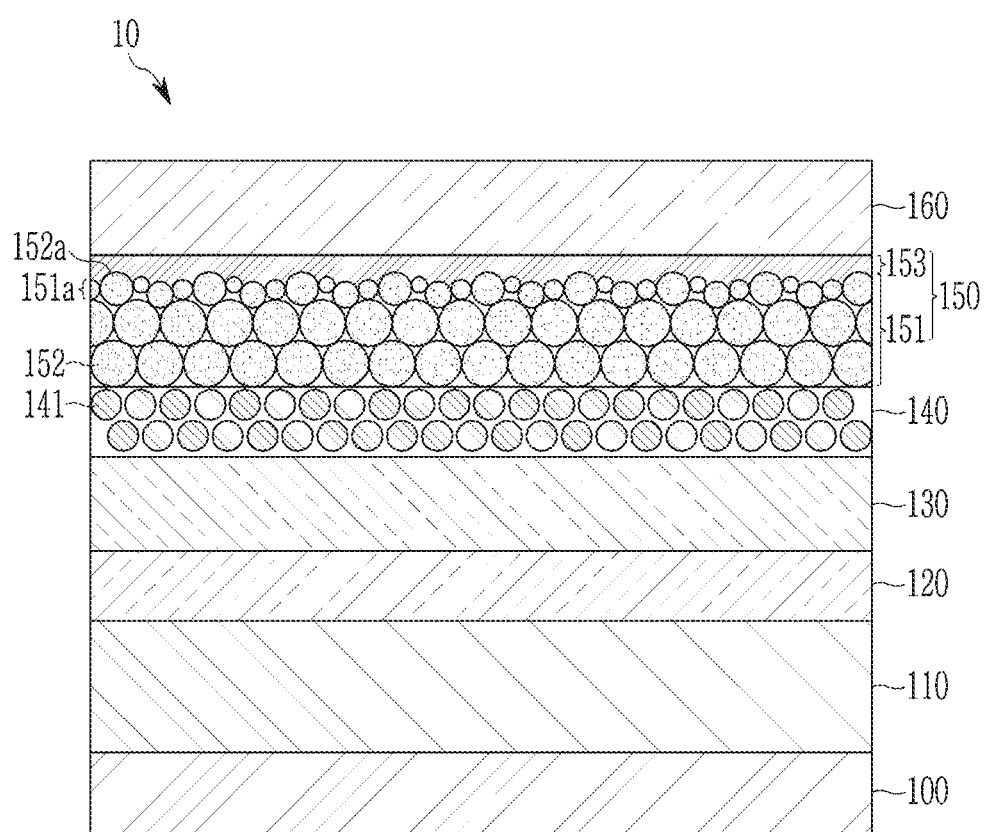
FIG. 1 is a schematic cross-sectional view of an electroluminescent device according to an embodiment.

Example embodiments of the present disclosure will hereinafter be described in detail, and may be understood by a person skilled in the art. However, this disclosure may be embodied in many different forms, and is not to be construed as limited to the example embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements. The term "a combination thereof" is open ended and means including at least one of the listed components, and may include other like components.

Further, the singular includes the plural unless mentioned otherwise.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In an embodiment, for sizes or particle diameters of various particles, although they may be numerized by a measurement to show an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. Unless particularly mentioning otherwise, average sizes or average particle diameters means to numeral average sizes or numeral average diameters in the present disclosure, and it is obtained by measuring D50 (particle diameters at a position of distribution rate of 50%). As used herein, "Group" in the term Group III, Group II, and the like refers to a group of Periodic Table.

As used herein, "Group II" refers to Group IIA and Group IIB, and examples of a Group II metal include Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal include Al, In, Ga, and Tl, but are not limited thereto. As used herein, "Group IV" refers to Group IVA and Group IVB, and examples of a Group IV metal include Si, Ge, and Sn, but are not limited thereto. As used herein, "metal" may include a semi-metal such as Si.

As used herein, "Group I" refers to Group IA and Group IB, and examples include Li, Na, K, Ru, and Cs, but are not limited thereto.

As used herein, "Group V" refers to Group VA, and examples include nitrogen, phosphorus, arsenic, antimony, and bismuth, but are not limited thereto.

As used herein, "Group VI" refers to Group VIA, and examples include sulfur, selenium, and tellurium, but are not limited thereto.

Hereinafter, a work function (WF), a highest occupied molecular orbital (HOMO) energy level, and a lowest unoccupied molecular orbital (LUMO) energy level are expressed as an absolute value from a vacuum energy level (i.e., 0 electron volts (eV)). In addition, when the work function, HOMO energy level, or LUMO energy level is said to be 'deep,' 'high', or 'large,' the work function or HOMO energy level has a larger absolute value from the vacuum energy level (0 eV), while when the work function, HOMO energy level, or LUMO energy level is 'shallow,' 'low,' or 'small,' the work function or HOMO energy level has a smaller absolute value from the vacuum energy level (0 eV).

First, referring to FIG. 1, a schematic structure of an electroluminescent device according to an embodiment is described.

FIG. 1 is a schematic cross-sectional view of an electroluminescent device according to an embodiment.

An electroluminescent device 10 according to an embodiment includes a first electrode 110 and a second electrode 160 facing each other, an emission layer 140 disposed between the first electrode 110 and the second electrode 160 and including a plurality of (e.g., at least two) light emitting particles 141, a hole transport layer 130 disposed between the first electrode 110 and the emission layer 140, and an electron transport layer 150 disposed between the emission layer 140 and the second electrode 160.

The electroluminescent device 10 according to an embodiment supplies current to the emission layer 140 including light emitting particles 141 through the first electrode 110 and the second electrode 160 and causes electroluminescence of the light emitting particles 141 to generate light. The electroluminescent device 10 may generate light in various wavelength regions according to materials, sizes, or fine structures of the light emitting particles 141 of the emission layer 140.

In an embodiment, the first electrode 110 may be directly connected to a driving power source so may function to flow current to the emission layer 140. The first electrode 110 may include a material having light transmittance in at least a visible light wavelength region but is not limited thereto. The first electrode 110 may include a material having light transmittance in an infrared or ultraviolet (UV) wavelength region. For example, the first electrode 110 may be made of an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. Meanwhile, in an embodiment, the first electrode 110 may be disposed on the substrate 100 as shown in FIG. 1. The substrate 100 may be a transparent insulating substrate or may be made of a ductile material. The substrate 100 may include a glass or a polymer material in a film having a glass transition temperature ($T_g$) of greater than about 150° C. For example, it may include a cycloolefin copolymer (COC) or cycloolefin polymer (COP)-based material.

In an embodiment, the substrate 100 supports the hole transport layer 130, the emission layer 140, and the electron transport layer 150 sandwiched by the first electrode 110 and the second electrode 160. However, the first electrode 110 of the electroluminescent device 10 according to an embodiment is not necessarily disposed on the substrate 100, and the substrate may be disposed on the second electrode 160 or may be omitted as needed.

The second electrode 160 includes an optically transparent material and may function as a light-transmitting electrode to transmit light generated in the emission layer 140 that will be described later. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Each of the first electrode 110 and the second electrode 160 may be formed by depositing a material for forming an electrode on the substrate 100 or an organic layer 153 described later by a method such as sputtering.

The emission layer 140 may include a plurality of light emitting particles 141 (i.e., at least two light emitting particles). The emission layer 140 may be formed by applying a resin in which at least two light emitting particles 141 are dispersed on a hole transport layer 130 (described later) and curing the same.

The emission layer 140 is a site where electrons and holes transported by a current supplied from the first electrode 110 and the second electrode 160, the electrons and holes are combined in the emission layer 140 to generate excitons, and the generated excitons are transited from an excited state to a ground state to emit light in a wavelength corresponding to the size of the light emitting particles 141.

In an embodiment, the light emitting particles 141 may include a quantum dot.

The quantum dot has a discontinuous energy bandgap by the quantum confinement effect. That is, when the emission layer 140 includes a quantum dot as a light emitting particle 141, the emission layer 140 may produce light having excellent color reproducibility and color purity.

In an embodiment, a material of the quantum dot is not particularly limited and known or commercially available quantum dots may be used. For example, the quantum dot may include a Group II-VI compound that does not include Cd, a Group III-V compound, a Group IV-VI compound, a Group IV element or compound, a Group compound, a Group I-II-IV-VI compound that does not include Cd, or a combination thereof. The quantum dot according to an embodiment may be a non-cadmium-based quantum dot. Like this, when the quantum dot comprises or consists of a non-cadmium-cadmium-based material, it has no toxicity compared with a conventional cadmium-based quantum dot and thus is less dangerous and is environmentally-friendly.

The Group II-VI compound may be a binary element compound that is ZnS, ZnSe, ZnTe, ZnO, HgS, HgSe, HgTe, MgSe, MgS, or a combination thereof; a ternary element compound that is ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound that is HgZnTeS, HgZnSeS, HgZnSeTe, HgZnSTe, or a combination thereof. The Group II-VI compound may further include a Group III metal.

The Group III-V compound may be a binary element compound that is GaN, GaP, GaAs, GaSb, AlN, AlP, AlAs, AlSb, InN, InP, InAs, InSb, or a combination thereof; a ternary element compound that is GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; or a quaternary element compound that is GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP).

The Group IV-VI compound may be a binary element compound that is SnS, SnSe, SnTe, PbS, PbSe, PbTe, or a combination thereof; a ternary element compound that is SnSeS, SnSeTe, SnSTe, PbSeS, PbSeTe, PbSTe, SnPbS, SnPbSe, SnPbTe, or a combination thereof; or a quaternary element compound that is SnPbSSe, SnPbSeTe, SnPbSTe, or a combination thereof. Examples of the Group compound may be CuInSe$_2$, CuInS$_2$, CuInGaSe, and CuInGaS, but are not limited thereto. Examples of the Group I-II-IV-VI compound may be CuZnSnSe and CuZnSnS, but are not limited thereto. Examples of the Group IV compound may be a single substance that is Si, Ge, or a combination thereof; or a binary element compound that is SiC, SiGe, or a combination thereof.

The binary element compound, the ternary element compound, or the quaternary element compound respectively may exist in a uniform concentration in the particle or in partially different concentrations in the same particle.

According to an embodiment, the quantum dot may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the quantum dot may have one semiconductor nanocrystal core and multiple shells surrounding the core. Herein, the multi-layered shell structure has a structure of two or more shells and each layer may have a single composition or an alloy, or may have a concentration gradient.

When the quantum dot according to an embodiment has a core-shell structure, a material composition of the shell has a larger energy bandgap than that of the core, which may exhibit an effective quantum confinement effect. However, the embodiment is not limited thereto. Meanwhile, in the multi-layered shell, a shell that is outside of the core has may have a higher energy bandgap than a shell that is near to the core and the quantum dot may have ultraviolet (UV) to infrared wavelength ranges.

The quantum dot may have an external quantum efficiency (EQE) of greater than or equal to about 10%, for example, greater than or equal to about 30%, greater than or equal to about 50%, greater than or equal to about 60%, greater than or equal to about 70%, greater than or equal to about 90%, or even 100%.

In a display, the quantum dot may have a relatively narrow spectrum so as to improve color purity or color reproducibility. The quantum dot may have for example a full width at half maximum (FWHM) of a wavelength spectrum of less than or equal to about 45 nm, less than or equal to about 40 nm, or less than or equal to or about 30 nm. Within the ranges, color purity or color reproducibility of a device may be improved.

The quantum dot may have an average particle diameter (the longest diameter for a non-spherically shaped particle) of about 1 nm to about 100 nm. For example, the quantum dot may have an average particle diameter of about 1 nm to about 20 nm, for example, about 2 nm (or about 3 nm) to about 15 nm.

In addition, a shape of the quantum dot particle may be general shapes in this art and thus may not be particularly limited. For example, the quantum dot particle may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dot may have any cross-sectional shape.

The quantum dot may be commercially available or may be synthesized in any method. For example, several nano-sized quantum dots may be synthesized according to a wet chemical process. In the wet chemical process, precursors react in an organic solvent to grow crystal particles, and the organic solvent or a ligand compound may coordinate the surface of the quantum dot, controlling the growth of the crystal. Examples of the organic solvent and the ligand compound are known. The organic solvent coordinated on the surface of the quantum dot may affect stability of a device, and thus excess organic materials that are not coordinated on the surface of the nanocrystals may be removed by pouring it in excessive non-solvent and centrifuging the resulting mixture. Examples of the non-solvent may be acetone, ethanol, methanol, and the like, but are not limited thereto. After the removal of excess organic materials, the amount of the organic materials coordinated on the surface of the quantum dot may be less than or equal to about 50% by weight (wt %), for example, less than or equal to about 30 wt %, less than or equal to about 20 wt %, or less than or equal to about 10 wt % based on a weight of the quantum dot. The organic material may include a ligand compound, an organic solvent, or a combination thereof.

The quantum dot may have for example an organic ligand having a hydrophobic moiety bound to its surface. In an embodiment, the organic ligand having the hydrophobic moiety may be RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The organic ligand may be a mono-functional group organic ligand and the functional group may be bound to the surface of the quantum dot.

In an embodiment, the hole transport layer 130 may be disposed between the first electrode 110 and the emission layer 140. The hole transport layer 130 may transport holes into the emission layer 140.

The electroluminescent device 10 according to an embodiment may further include a hole injection layer 120 between the hole transport layer 130 and the first electrode 110. The hole injection layer 120 supplies holes to the hole transport layer 130.

Each of the hole injection layer 120 and the hole transport layer 130 may include, independently, for example poly(3,4-ethylenedioxythiophene):poly(styrenesulfonate) (PEDOT:PSS), poly(9,9-dioctyl-fluorene-co-N-(4-butylphenyl)-diphenylamine) (TFB), a polyarylamine, poly(N-vinylcarbazole), a polyaniline, a polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4,4''-tris[phenyl(m-tolyl)amino]triphenylamine), 4,4',4''-tris(N-carbazolyl)-triphenylamine (TCTA), 1,1-bis[(di-4-tolylamino)phenyl]cyclohexane (TAPC), or a combination thereof, but is not limited thereto. Various semiconductor materials, or combinations thereof may be applied according to an internal energy level of the electroluminescent device 10.

The hole injection layer 120 and the hole transport layer 130 according to an embodiment may be formed by coating a solution-type commercially available materials on the first electrode 110 and then curing the same but is not limited thereto.

In an embodiment, the electron transport layer 150 is disposed between the emission layer 140 and the second electrode 160 and transports electrons into the emission layer 140.

The electron transport layer 150 according to an embodiment may comprise or consist of a non-light-emitting charge transporting material that does not emit light by an electric field. Thereby, internal light emission of the electroluminescent device 10 according to an embodiment occurs in the emission layer 140 and not in the electron transport layer 150.

The electron transport layer 150 according to an embodiment may include an inorganic layer 151 formed on the emission layer 140 and including a plurality of inorganic nanoparticles 152 (i.e., two or more inorganic nanoparticles) and an organic layer 153 formed directly on the inorganic layer 151 on a side opposite the emission layer 140.

As shown in FIG. 1, the inorganic layer 151 may directly be formed on the emission layer 140.

The inorganic layer 151 may include two or more (i.e., plurality of) inorganic nanoparticles 152 and the two or more inorganic nanoparticles 152 may be agglomerated with each other to form a cluster layer. In an embodiment, the inorganic layer 151 may include a cluster layer composed of two or more inorganic nanoparticles 152. In an embodiment, the inorganic layer 151 may be a cluster layer composed of two or more inorganic nanoparticles 152 (accordingly, the inorganic layer 151 may be expressed as cluster layer 151 in FIG. 1)

In the case where the cluster layer composed of two or more inorganic nanoparticles 152 is directly on the emission layer 140, the non-emission quenching of the charge exchange excitons generated in the emission layer 140 may be reduced or prevented, and the luminance of the emission layer 140 may be improved.

The inorganic nanoparticles 152 according to an embodiment may include inorganic oxide nanoparticles including ZnO, $TiO_2$, $ZrO_2$, $SnO_2$, $WO_3$, $Ta_2O_3$, or a combination thereof, but are not limited thereto.

In the case where the cluster layer is made of inorganic oxide nanoparticles, for example, the emission layer 140 including a non-cadmium quantum dot generates a large amount of charge exchange excitons due to internal heat generation during driving of the device, and the generated charge exchange exciton may emit auger electrons on the interface with the cluster layer without non-emission quenching by the cluster layer. The emitted auger electrons may emit light by recombination with holes in the emission layer 140, roll-off of the electroluminescent device 10 in a high luminance region may be minimized.

On the other hand, an average particle diameter (as for a non-spherically shaped particle, diameter means the longest dimension) of the inorganic nanoparticles 152 according to an embodiment may be for example less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm and for example greater than or equal to about 1 nm, greater than or equal to about 2 nm, greater than or equal to about 3 nm, greater than or equal to about 4 nm, or greater than or equal to about 5 nm.

When the inorganic layer 151 includes the cluster layer composed of two or more inorganic nanoparticles 152 as described above, electron mobility thereof is much higher than that of a general inorganic semiconductor film or an organic semiconductor film. Therefore luminescence stability and the luminance of the non-cadmium quantum dot may be improved through the cluster layer to which the inorganic layer 151 is applied.

In addition, an average thickness of the cluster layer according to an embodiment may be for example less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm and for example greater than or equal to about 10 nm, greater than or equal to about 15 nm, greater than or equal to about 20 nm, greater than or equal to about 25 nm, or greater than or equal to about 30 nm.

When the average particle diameter of the inorganic nanoparticles 152 and the average thickness of the cluster layer are within the above ranges, the inorganic layer 151 may exhibit excellent electron mobility.

Figure 2:
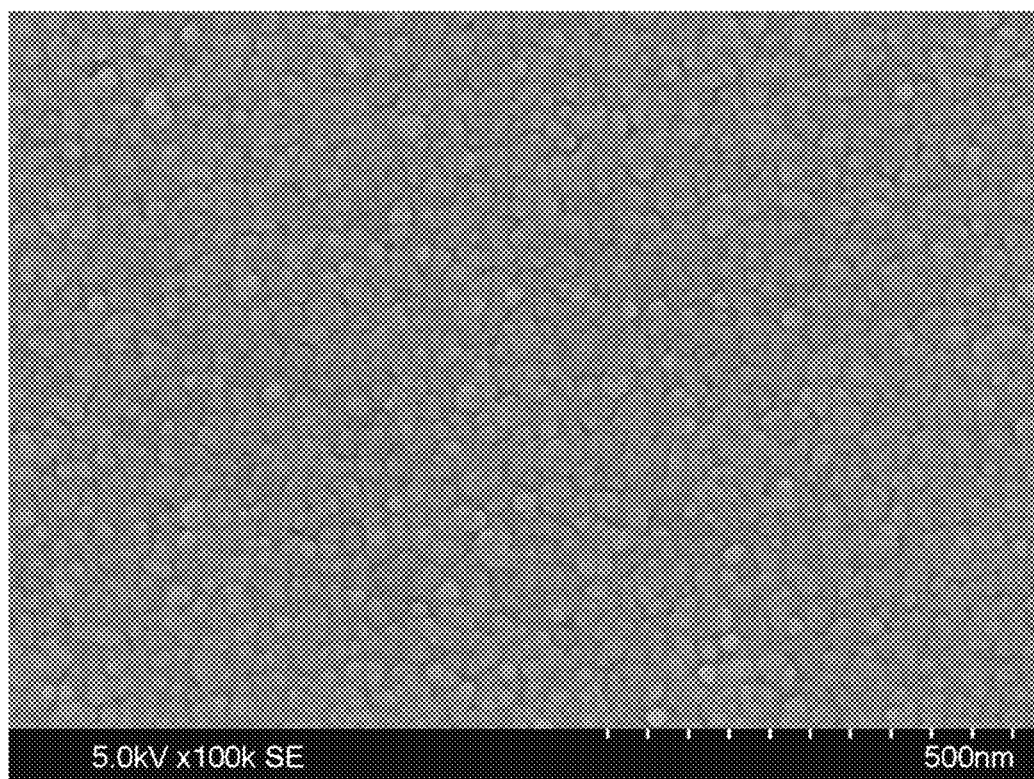
FIG. 2 is a scanning electron microscope (SEM) image showing the upper surface of the inorganic layer of the electroluminescent devices according to an embodiment.
Figure 3A:
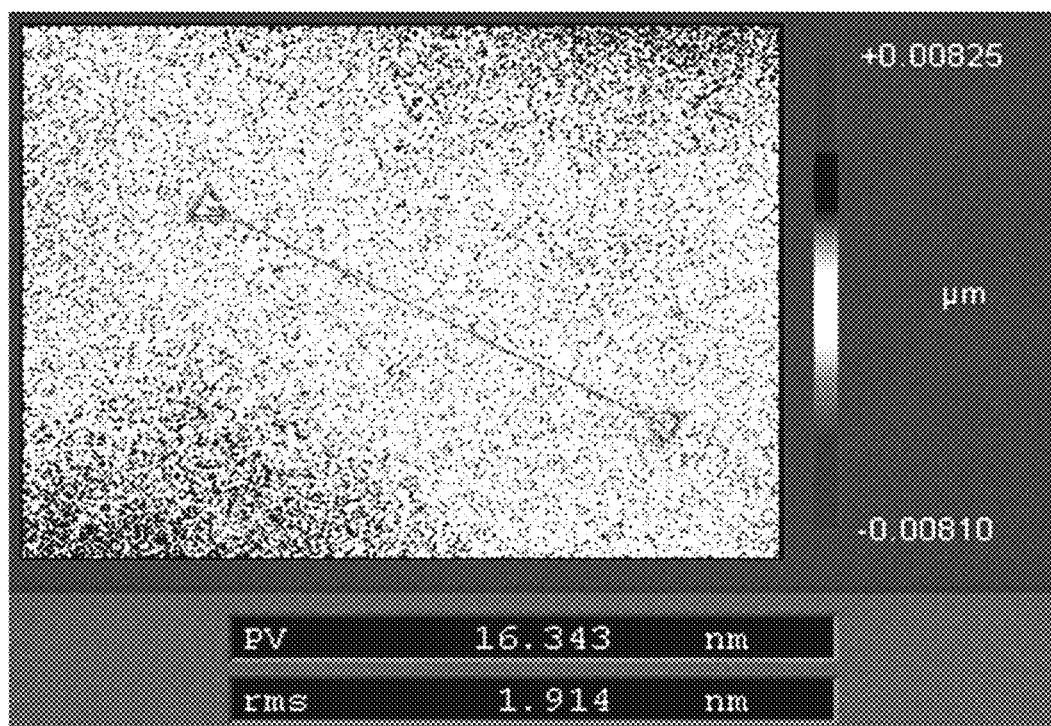
FIG. 3A is a three-dimensional contour image of an upper surface of an inorganic layer according to an embodiment as measured using a Zygo interferometer.
Figure 3B:
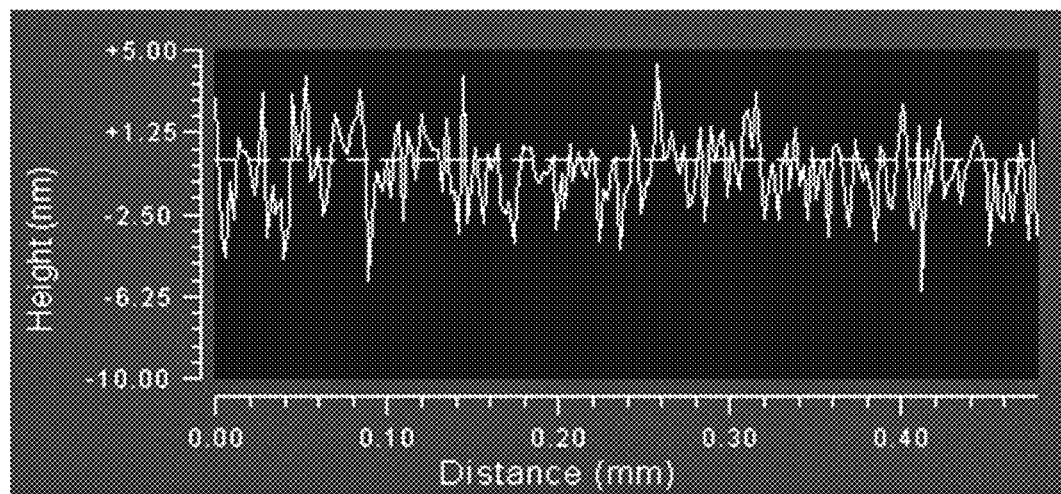
FIG. 3B is a graph of height (nanometers, nm) versus distance (millimeters, mm) for the linear portion indicated in FIG. 3A.

FIG. 2 is a microscopic image showing the upper surface of the inorganic layer of the electroluminescent devices according to an embodiment and FIG. 3 is a graph showing an upper surface three-dimensional shape image and a height deviation depending on a position of an inorganic layer and a position of the inorganic layer of the electroluminescent device according to an embodiment measured using a Zygo interferometer.

FIGS. 2 and 3 correspond to a case where a cluster layer having a thickness of about 40 nm is formed by agglomerating ZnO nanoparticles having an average particle diameter of 3 nm.

First, referring to FIG. 2, it may be seen that the surface of the cluster layer includes two or more grains composed of inorganic nanoparticles and a grain boundary formed between neighboring grains.

In addition, referring to the graph showing the surface roughness curve of the linear portion indicated in the surface profile image of the cluster layer of FIG. 3, a peak to valley (PV) of the surface of the cluster layer is 16.343 nm and a root mean square roughness (Rq) calculated by a root mean square (rms) method is 1.914 nm.

Thus, referring now to FIG. 1, the surface region 151*a* of the cluster layer according to an embodiment may exhibit an uneven surface morphology, which may be caused by a non-uniform agglomeration of the inorganic nanoparticles 152*a* in the surface region 151*a*, a particle size variation of the inorganic nanoparticles 152*a* in the surface region 151*a*, detachment of the inorganic nanoparticles 152*a* from the cluster layer, or the like, or a combination thereof, which results in the existence of grain boundaries in the surface region 151*a*. In some embodiments, the upper surface of the cluster layer includes the surface region 151*a* having two or more grains each comprising inorganic nanoparticles, wherein a grain boundary is formed between adjacent grains. The inorganic nanoparticles in the surface region 151*a* can include inorganic nanoparticles 152*a*. In other words, the inorganic nanoparticles 152*a* are inorganic nanoparticles of the plurality of nanoparticles that are not included in the cluster layer.

On the other hand, according to an embodiment, the organic layer 153 is formed directly on at least a portion of the inorganic layer 151. The organic layer 153 may be formed through a deposition process or the like on the cluster layer of the inorganic nanoparticles 152.

The organic layer 153 is a layer composed of organic semiconductor compounds and may include conductive monomolecular molecule, a low molecular organic nanomaterial having a conjugation structure, or a combination thereof. Specific examples of the organic semiconductor compounds forming the organic layer 153 may be a quinolone-based compound, a triazine-based compound, a quinoline-based compound, a triazole-based compound, a naphthalene-based compound, or a combination thereof, but are not limited thereto. In some embodiments, the organic semiconductor compound can be phosphine oxide based compound (NET-218, Novaled Electron Transport material 218, obtained from Novaled), phosphonyl phenol based compound (NDN-87, Novaled Dopant n-side material 87, obtained from Novaled), or a combination thereof.

The organic layer 153 may be composed of an organic semiconductor compound having a higher work function than that of the inorganic layer 151. Accordingly, the organic layer 153 may be an energy barrier against electrons moving from the second electrode 160 to the inorganic layer 151.

A LUMO (Lowest Unoccupied Molecular Orbital) energy level of the organic layer 153 may be for example about −1.8 electron Volts (eV) to about −2.8 eV, about −1.8 eV to −about 2.7 eV, about −1.8 eV to about −2.6 eV, about −1.8 eV to about −2.5 eV, − about 1.8 eV to about −2.4 eV, about −1.8 eV to about −2.3 eV, or about −1.8 eV to about −2.2 eV.

On the other hand, the organic layer 153 may have for example, electron mobility of greater than or equal to about $10^{-4}$ square centimeters per Volt-second ($cm^2/V \cdot s$) or greater than or equal to about $10^{-3}$ $cm^2/V \cdot s$, and for example, less than or equal to about 1 $cm^2/V \cdot s$ or less than or equal to about $10^{-1}$ $cm^2/V \cdot s$.

The organic layer 153 according to an embodiment fully or completely covers the upper surface of the inorganic layer 151, so that the inorganic layer 151 may not be exposed toward the second electrode 160 as shown in FIG. 1. In other words, the organic layer 153 is disposed on and in contact with the entire upper surface of the inorganic layer 151. Accordingly, the organic layer 153 fills at least a part or a whole of a grain boundary formed at, on, or in the surface (i.e., in the surface region 151*a*) between the inorganic nanoparticles 152*a*) of the cluster layer being in contact therewith.

On the other hand, the organic layer 153 may fill a part of or all of the cracks or voids generated by detachment or non-uniform agglomeration of the inorganic nanoparticles 152*a* on the surface of the cluster layer being in contact therewith. In some embodiments, the organic layer 153 is disposed on the upper surface of the inorganic layer 151 such that substantially all of the cracks, voids, grain boundaries, or the like, at the upper surface are filled with or include the semiconductor organic compounds of the organic layer 153.

A thickness of the organic layer 153 may be variously designed depending on electron mobility, a work function, and the like of the organic layer 153. It may be thin enough to transport at least electrons through tunneling to the inorganic layer 151 while it may be thick enough to fill a grain boundary, a crack, and a void on the surface of the inorganic layer 151 and not expose but cover the inorganic layer 151.

In an embodiment, a thickness of the organic layer 153 may be for example less than or equal to about 20 nm, less than or equal to about 18 nm, less than or equal to about 16 nm, less than or equal to about 14 nm, less than or equal to about 12 nm, less than or equal to about 10 nm, less than or equal to about 8 nm, less than or equal to about 6 nm, or less than or equal to about 4 nm and for example greater than or equal to about 2 nm, greater than or equal to about 2.5 nm, or greater than or equal to about 3 nm.

Since the organic layer 153 has a higher work function than the inorganic layer 151, a driving voltage for transporting electrons may be increased compared with a case of using the inorganic layer alone as an electron transport layer. However, when the organic layer 153 according to an embodiment has a LUMO and an electron mobility within the range and in addition, a thickness adjusted within the range, the driving voltage and an electron mobility rate may be adjusted to have an appropriate level due to band bending and tunneling effects.

On the other hand, the organic layer 153 may include at least two different organic semiconductor compounds. The organic layer 153 according to an embodiment may be formed, for example, in a method of co-depositing at least two different organic semiconductor compounds, or the like.

For example, when either one of the organic semiconductor compounds is used, a plurality of island-shaped intermediates is formed due to uneven morphology on the surface of the inorganic layer 151 during the formation of the organic semiconductor compound, and accordingly, the organic layer 153 may have a large thickness deviation. On the other hand, when at least two different organic semiconductor compounds are used, the organic layer 153 may have a relatively small thickness deviation.

In addition, the organic layer 153 may include two different organic semiconductor compounds (a first organic semiconductor compound and a second organic semiconductor compound).

Herein, the first organic semiconductor compound and the second organic semiconductor compound in the organic layer 153 may be used in various weight ratios depending on materials of each organic semiconductor compound, wherein the weight ratio may be adjusted to minimize formation of the island-shaped intermediate.

In an embodiment, the first organic semiconductor and the second organic semiconductor in the organic layer 153 may, for example, have a weight ratio of about 2:8 to about 8:2, about 3:7 to about 7:3, about 4:6 to about 6:4, or about 5:5.

On the other hand, additional units including the inorganic layer 151 and the organic layer 153 may be alternately stacked on the emission layer 140. In other words, the electron transport layer 150 may include plurality of stacked units, such as at least two stacked units, with each unit including the inorganic layer 151 and the organic layer 153. In this way, the number of alternately stacking units each including the inorganic layer 151 and the organic layer 153 may be adjusted to appropriately maintain a charge carrier balance in an electroluminescent device by considering each energy level of the first electrode 110, the second electrode 160, the hole injection layer 120, the hole transport layer 130, and the emission layer 140, a difference of their energy differences, and the like.

On the other hand, when the cluster layer composed of the inorganic nanoparticles is applied to an emission layer including quantum dots, device efficiency at high luminance may be secured, but since a crack, a void, a grain boundary, or the like on the surface of the cluster layer may for example result in a leakage path of a current, a leakage current from the leakage path may deteriorate device efficiency at a low voltage and in a low luminance region.

However, the electroluminescent device 10 according to an embodiment includes the organic layer 153 filling the crack, the void, the grain boundary, or the like, on the surface of the cluster layer and thus may minimize the generation of the leakage current due to the cluster layer.

The electroluminescent device 10 according to an embodiment may further include an electron injection layer (not shown) between the second electrode 160 and the electron transport layer 150 and may further include an electron blocking layer (not shown) between the second electrode 160 and the electron injection layer (not shown) or between the electron injection layer (not shown) and the electron transport layer 150. However, the embodiment is not limited thereto and the electron injection layer (not shown) and the electron blocking layer (not shown) may be omitted in order to maintain charge carrier balance of the electroluminescent device 10 to be an appropriate level.

Hereinafter, referring to FIG. 4, a driving principle of an electroluminescent device according to an embodiment is explained.

Figure 4:
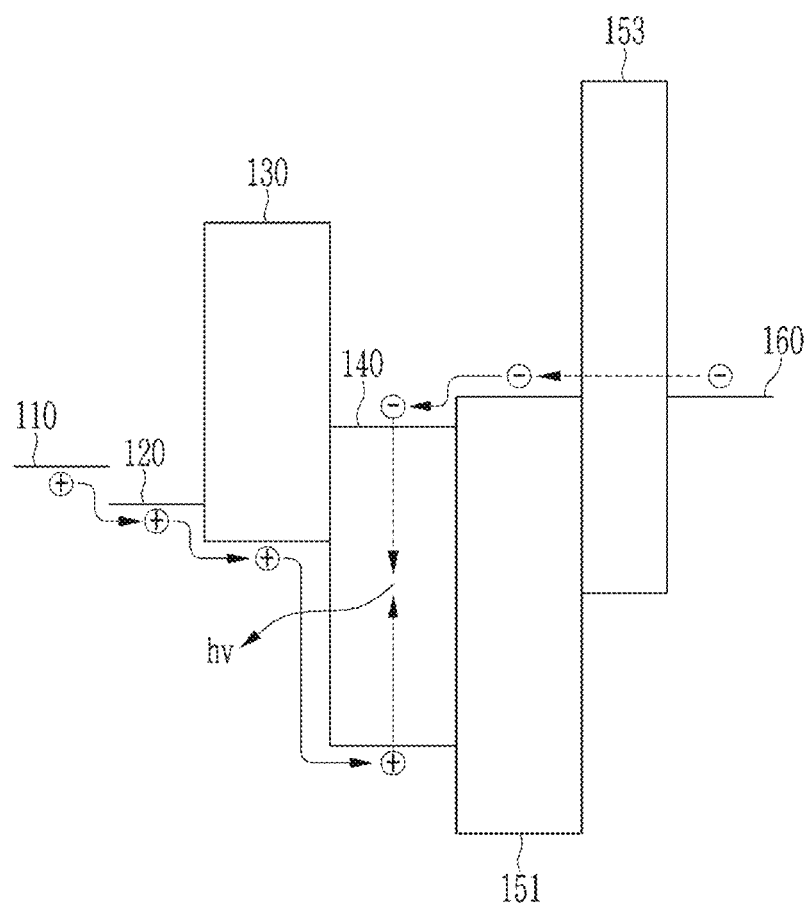
FIG. 4 is a schematic energy band diagram of an electroluminescent device according to an embodiment.

FIG. 4 is an energy band diagram showing an electroluminescent device according to an embodiment.

The electroluminescent device 10 according to an embodiment includes quantum dots as the light emitting particles 141, and accordingly, the emission layer 140 formed thereof has a different energy level from that of a general organic light emitting diode.

In particular, the general electroluminescent device sequentially transports electrons along with a LUMO energy level from an electrode through an electron transport layer toward an emission layer, but the electroluminescent device 10 according to an embodiment has the organic layer 153 having a higher LUMO energy level than that of the inorganic layer 151 and thus working as a high energy barrier. Accordingly, the electron transport layer 150 according to an embodiment has a hybrid structure consisting of the inorganic layer 151 as a cluster layer formed of inorganic nanoparticles and the organic layer 153 covering the inorganic layer 151.

In an embodiment, when the cluster layer formed of inorganic nanoparticles is formed on the surface of the emission layer 140 including quantum dots, this cluster layer has very high electron mobility relative to hole mobility between the hole injection layer (HIL) 120 and the hole transport layer (HTL) 130, and a leakage current may be generated due to uneven surface morphology of the cluster layer.

Accordingly, in an embodiment, the organic layer 153 having a higher work function than that of the cluster layer may be formed to cover the surface of the cluster layer to minimize the leakage current generated from the cluster layer. In addition, the organic layer 153, as shown in FIG. 4, simultaneously works as a kind of an energy barrier and thus may adjust entire electron mobility of the electron transport layer 150 into an appropriate level and thus improve a charge carrier balance.

As described above, the electroluminescent device 10 according to an embodiment includes the inorganic layer 151 having very high electron mobility and improving luminous efficiency of the emission layer 140 including quantum dots and the organic layer 153 minimizing the leakage current due to the surface morphology of the inorganic layer 151 and simultaneously, adjusting entire electron mobility of the electron transport layer 150 into an appropriate level, and accordingly, the electron transport layer 150 has a hybrid stacking structure of the inorganic layer 151/the organic layer 153.

Accordingly, the electroluminescent device 10 according to an embodiment may improve a charge carrier balance and light extraction efficiency of an emission layer and also, minimize a leakage current and thus show excellent driving characteristics and life-span characteristics.

A display device according to an embodiment including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the light emitted from each of the quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing (i.e., emitting) red, green, or blue colored light, respectively, in the display device.

However, an embodiment is not necessarily limited thereto, and the first to third electroluminescent devices may respectively express magenta, yellow, or cyan, or may express other colors.

One or more of the first to third electroluminescent devices may be the electroluminescent device 10. For example, an electroluminescent device displaying blue in the display device is the electroluminescent device 10 and electroluminescent devices displaying red and green may include an electron transport layer that consists of an organic layer or inorganic layer or that includes both organic layer and inorganic layer, provided that an organic layer is formed directly on the emission layer. Alternatively, one of the first to third electroluminescent devices may be the electroluminescent device 10 and the rest may be electroluminescent devices including a fluorescent material or a phosphor material instead of the quantum dot as the light emitting particle.

The substrate may be a transparent insulating substrate or may be made of a ductile material. The substrate may include glass or a polymer material in a film having a glass transition temperature ($T_g$) of greater than about 150° C. For example, it includes a cycloolefin copolymer (COC) or cycloolefin polymer (COP) based material.

The driving circuit is disposed on the substrate and is independently connected to each of the first to third electroluminescent devices. The driving circuit may include at least one set of lines including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, a display device according to an embodiment may display images having improved color purity and color reproducibility without separate light source such as a backlight unit, and particularly may exhibit improved driving characteristics and life-span characteristics.

Hereinafter, the embodiments are illustrated in more detail with reference to examples. However, these examples are exemplary, and the present disclosure is not limited thereto.

EXAMPLES

Example 1

An indium time oxide (ITO) layer is deposited on a glass substrate as a first electrode (anode), and a PEDOT:PSS layer (hole injection layer) and a poly(9,9-dioctyl-fluorene-co-N-(4-butylphenyl)-diphenylamine) (TFB) polymer layer (hole transport layer) are respectively and sequentially formed thereon by using a solution process. Subsequently, a blue emission layer is formed thereon by coating blue quantum dots (ZnTeSe) dispersed in an organic solvent and heat-treating it under a nitrogen atmosphere at 80° C. for 30 minutes.

On the other hand, ZnO particles having an average particle diameter of 3 nm are three times washed and then, formed into a ZnO cluster layer (inorganic layer) having a thickness of about 40 nm on the blue emission layer. Subsequently, on the surface of the ZnO cluster layer, an organic layer which includes organic compound 1 (a phosphine oxide compound, Novaled Electron Transport material 218 (NET-218), obtained from Novaled) (organic layer) is formed to be 2 nm to 20 nm thick at a deposition rate of 0.5 Å/s to 1.0 Å/s, and an Al layer is deposited thereon to manufacture an electroluminescent device according to Example 1.

Example 2

An electroluminescent device is manufactured according to the same method as Example 1 except that the organic compound 1 and an organic compound 2 (phosphonyl phenol compound, Novaled Dopant n-side material 87 (NDN-87), obtained from Novaled) in a weight ratio of 1:1 are co-deposited to form an organic layer having the organic compound 1: organic compound 2 blend instead of organic compound 1.

Example 3

An electroluminescent device is manufactured according to the same method as Example 1, except that the ZnO cluster layer is formed to have a thickness of 20 nm.

Comparative Example 1

An electroluminescent device is manufactured according to the same method as Example 1, except that the Al layer is formed directly on the ZnO cluster without forming the organic layer.

Comparative Example 2

An electroluminescent device is manufactured according to the same method as Example 1, except that a ZnO: organic compound 1 blend layer is formed on the blue emission layer by twice to three times washing the ZnO particles having an average particle diameter of 3 nm and then mixing them with the organic compound 1 in a weight ratio of 20:1, and then, the Al layer is deposited thereon.

Comparative Example 3

An electroluminescent device is manufactured according to the same method as Comparative Example 2, except that a ZnO: organic compound 2 blend layer is formed by mixing ZnO and the organic compound 2 in a weight ratio of 20:1, instead of using the organic compound 1.

Comparative Example 4

An electroluminescent device is manufactured according to the same method as Example 1, except that the Al layer is formed directly on the ZnO cluster without forming the organic layer.
Characterization First, I-V-L characteristics of the electroluminescent devices according to Example 1 and Comparative Examples 1 to 3 are respectively shown in FIGS. 5 to 7, and J-V characteristics thereof are shown in FIG. 8.

Figure 5:
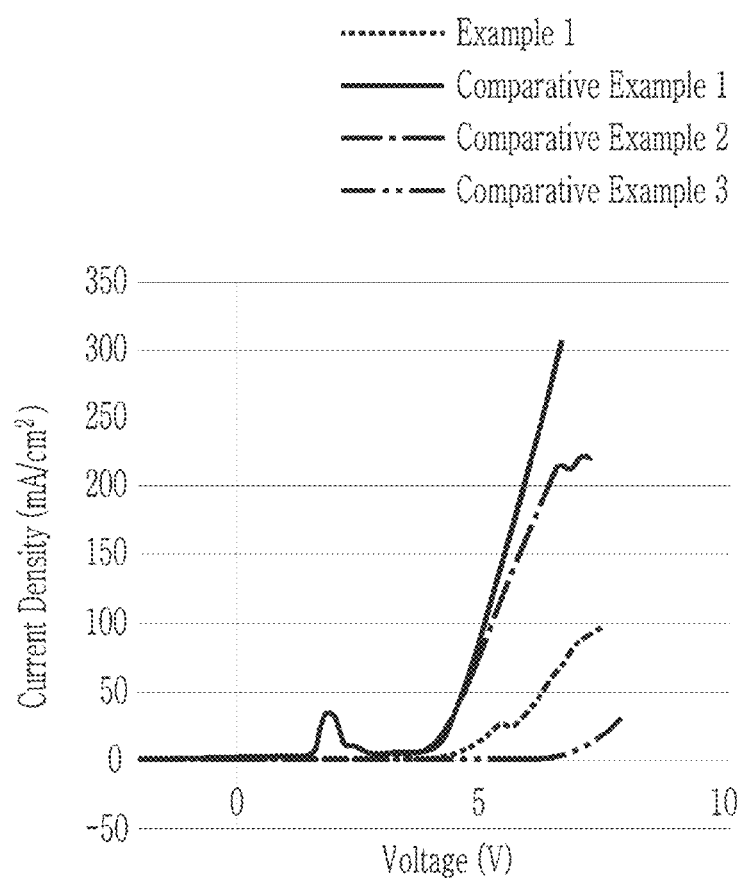
FIG. 5 is a graph of current density (milliamperes per square centimeter, $mA/cm^2$) versus Voltage (volts, V) showing a voltage-current density relationship of the electroluminescent devices according to Example 1 and Comparative Examples 1 to 3.
Figure 6:
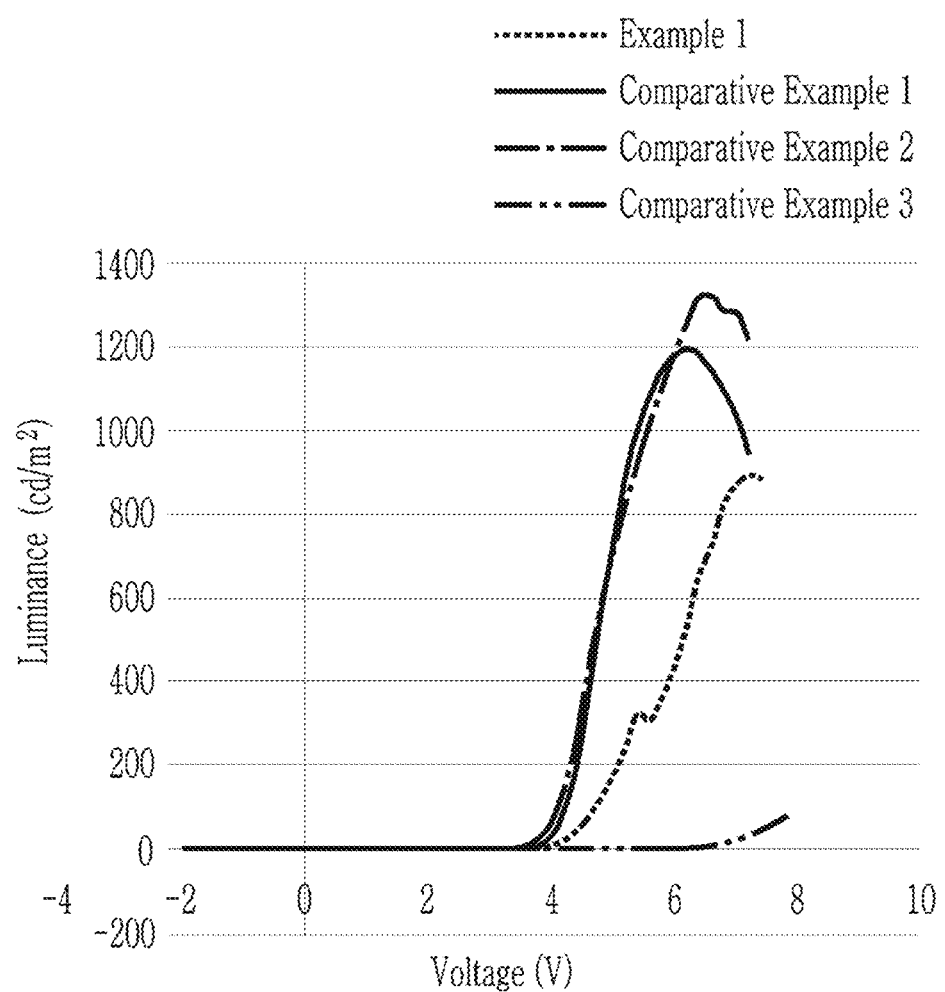
FIG. 6 is a graph of luminescence (candela per square meter, $cd/m^2$) versus Voltage (V) showing a voltage-luminance relationship of the electroluminescent devices according to Example 1 and Comparative Examples 1 to 3.
Figure 7:
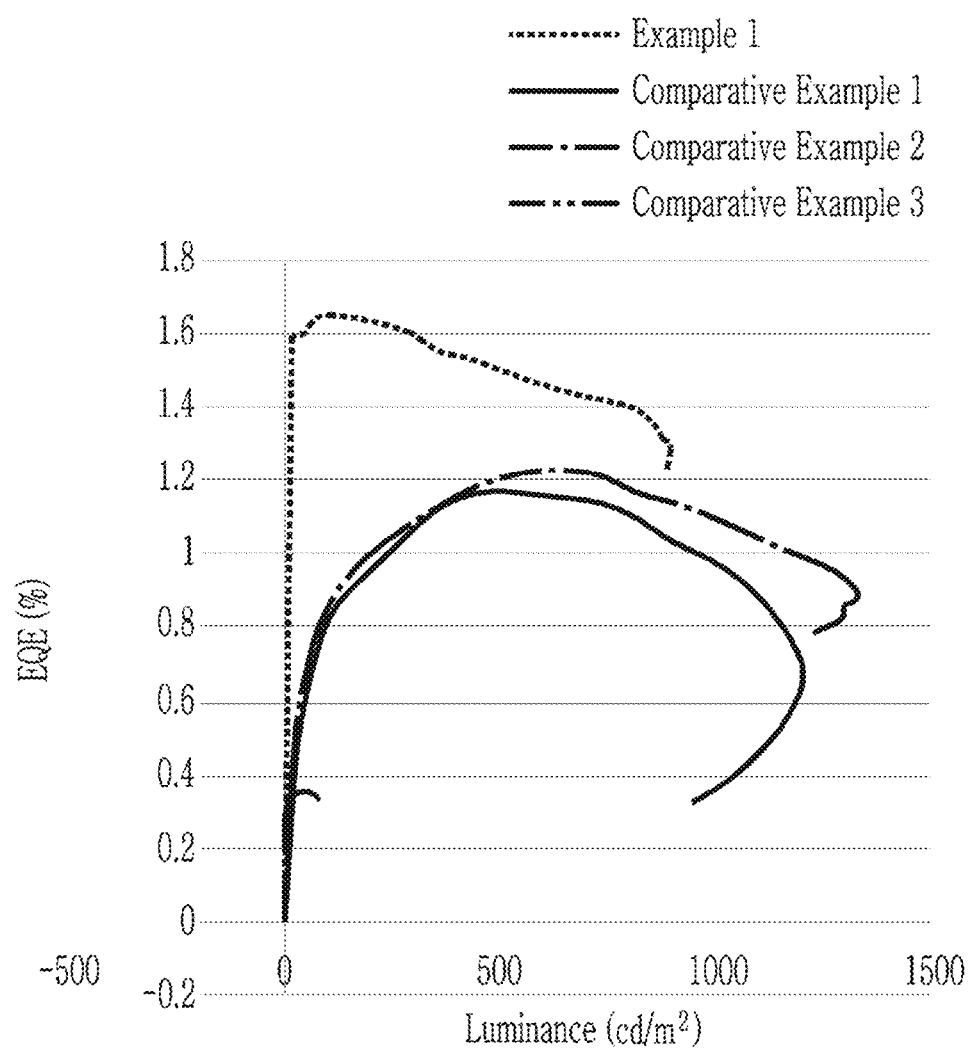
FIG. 7 is a graph of external quantum efficiency (EQE, %) versus luminescence ($cd/m^2$) showing a luminance-external quantum efficiency relationship of the electroluminescent devices according to Example 1 and Comparative Examples 1 to 3.
Figure 8:
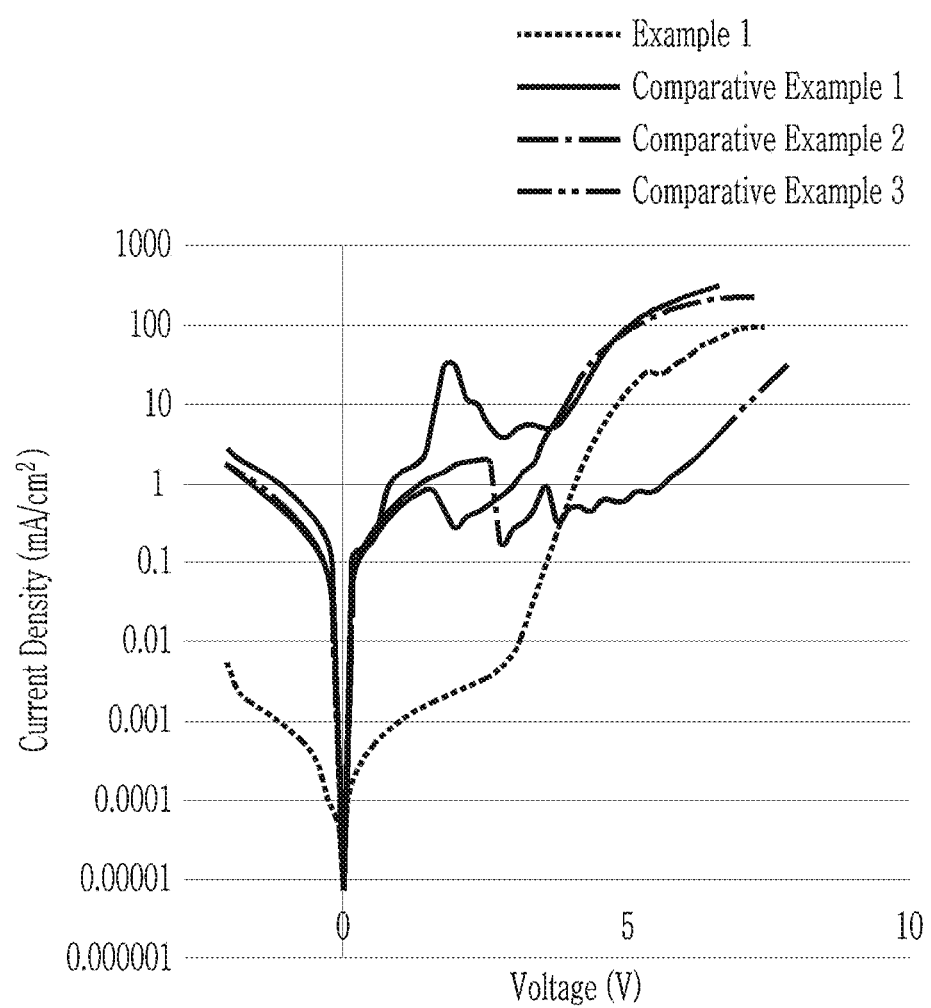
FIG. 8 is a graph of current density ($mA/cm^2$, logarithmic scale) versus Voltage (V) showing a voltage-current density relationship of the electroluminescent devices according to Example 1 and Comparative Examples 1 to 3.

FIGS. 5 to 7 are graphs showing I-V-L characteristics of the electroluminescent devices according to Example 1 and Comparative Examples 1 to 3; FIG. 5 shows voltage-current density, FIG. 6 shows voltage-luminance, and FIG. 7 shows luminance-external quantum efficiency (EQE), respectively.

Referring to FIGS. 5 and 6, Example 1 shows a lower current density at the same voltage and a lower luminance at the same voltage compared with Comparative Examples 1 and 2, and the reason is that the organic layer including organic compound 1 works as an energy barrier and decreases current density at a lower voltage.

However, referring to FIG. 7, Example 1 shows very excellent external quantum efficiency at luminance of less than or equal to about 1000 cd/m$^2$ compared with the Comparative Examples. In particular, Example 1 shows the best external quantum efficiency (about 1.7%) at a luminance of about 100 cd/m$^2$. In addition, Example 1 shows a smaller external quantum efficiency decrease at a higher voltage in a higher luminance region compared with the Comparative Examples, and thus provides stable driving characteristics.

In other words, since the organic layer including organic compound 1 is further formed on the ZnO cluster layer and thus works as an energy barrier against electrons moving from the Al layer to the ZnO cluster layer, Example 1 has a slight decrease in current density and luminance but shows excellent luminous efficiency at low luminance.

On the other hand, Comparative Example 3 shows lower current density at the same voltage, lower luminance at the same voltage, and lower external quantum efficiency at the same luminance compared with Example 1 as well as Comparative Example 2, and these results are expected based on a difference of organic semiconductor materials.

FIG. 8 is a graph showing a voltage-current density relationship of the electroluminescent devices according to Example 1 and Comparative Examples 1 to 3. FIG. 8 is a graph showing the current density in the y-axis on a logarithmic scale.

Referring to FIG. 8, Example 1 has an inorganic-organic hybrid stacking structure by further forming the organic layer including organic compound 1 on the surface of the ZnO cluster layer and thus shows about 1,000 times less current leakage compared with Comparative Example 1 including only the ZnO cluster layer and no organic layer.

On the other hand, when electroluminescence intensity relative to a wavelength is examined regarding the electroluminescent device of Example 1, the electroluminescent device of Example 1 shows a narrow full width at half maximum (FWHM) of about 28 nm.

Figure 9:
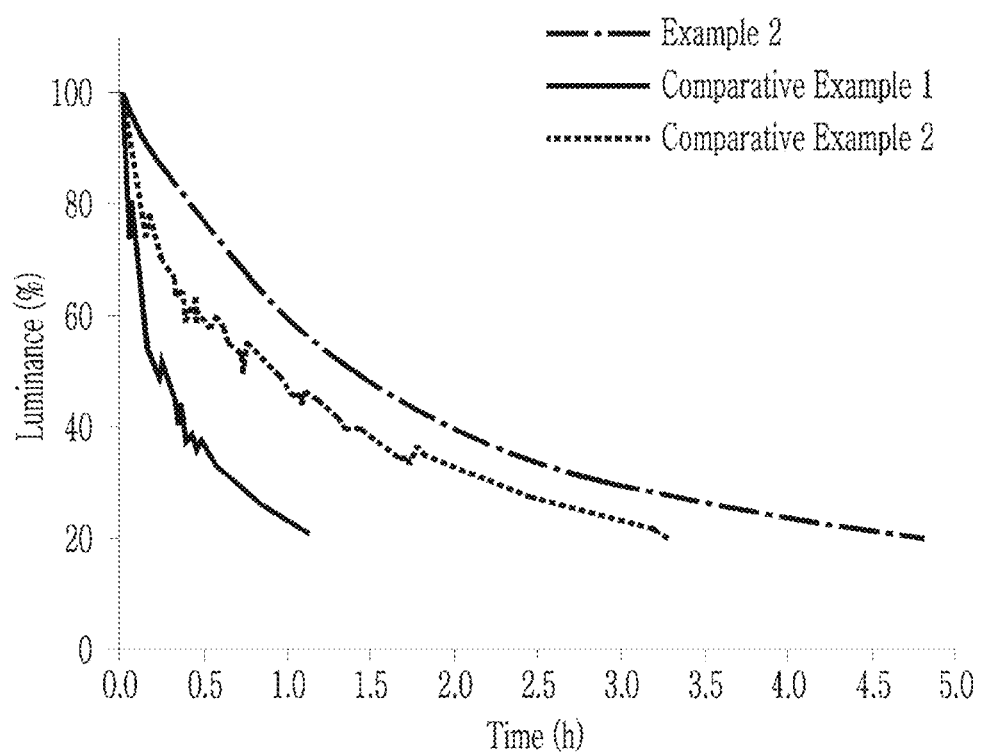
FIG. 9 is a graph of luminance (%) versus time (hour, h) showing a time-luminance relationship of the electroluminescent devices according to Example 2, Comparative Example 1, and Comparative Example 2.

The electroluminescent devices according to Example 2 and Comparative Examples 1 and 2 are measured regarding a luminance decrease depending on time, and the results are shown in FIG. 9.

FIG. 9 is a time-luminance graph of the electroluminescent devices according to Example 2, Comparative Example 1, and Comparative Example 2.

Referring to FIG. 9, the electroluminescent device of Example 2 shows a slower rate of luminance decrease compared with those of Comparative Examples 1 and 2, and when T50 is defined as a time when an electroluminescent device shows 50% luminance relative to initial luminance, Example 2 shows the longest T50 of 1.42 hours, Comparative Example 1 shows T50 of 0.27 hours, and Comparative Example 2 shows T50 of 0.74 hours.

The life-span characteristics decrease as a leakage path due to surface morphology of the ZnO cluster layer increases, and accordingly, Example 2 including the organic layer including the organic compound 1: organic compound 2 blend covering and minimizing the leakage path of the ZnO cluster layer shows excellent life-span characteristics compared with the Comparative Examples.

Figure 10:
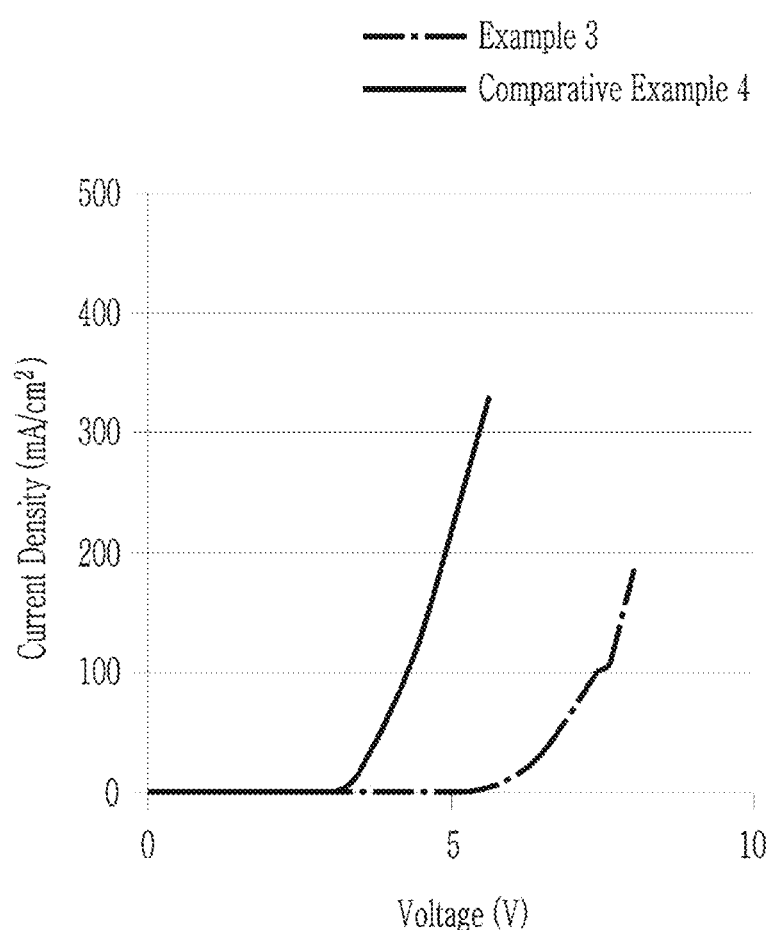
FIG. 10 is a graph of current density ($mA/cm^2$) versus Voltage (V) showing a voltage-current density relationship of the electroluminescent devices according to Example 3 and Comparative Example 4.
Figure 11:
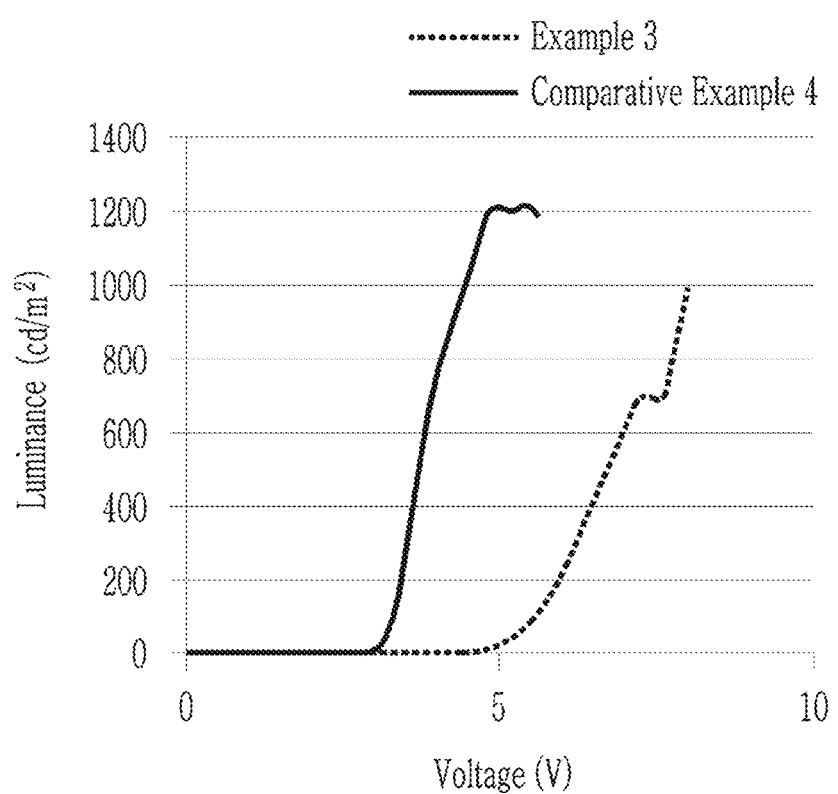
FIG. 11 is a graph of luminescence ($cd/m^2$) versus Voltage (V) showing a voltage-luminance relationship of the electroluminescent devices according to Example 3 and Comparative Example 4.
Figure 12:
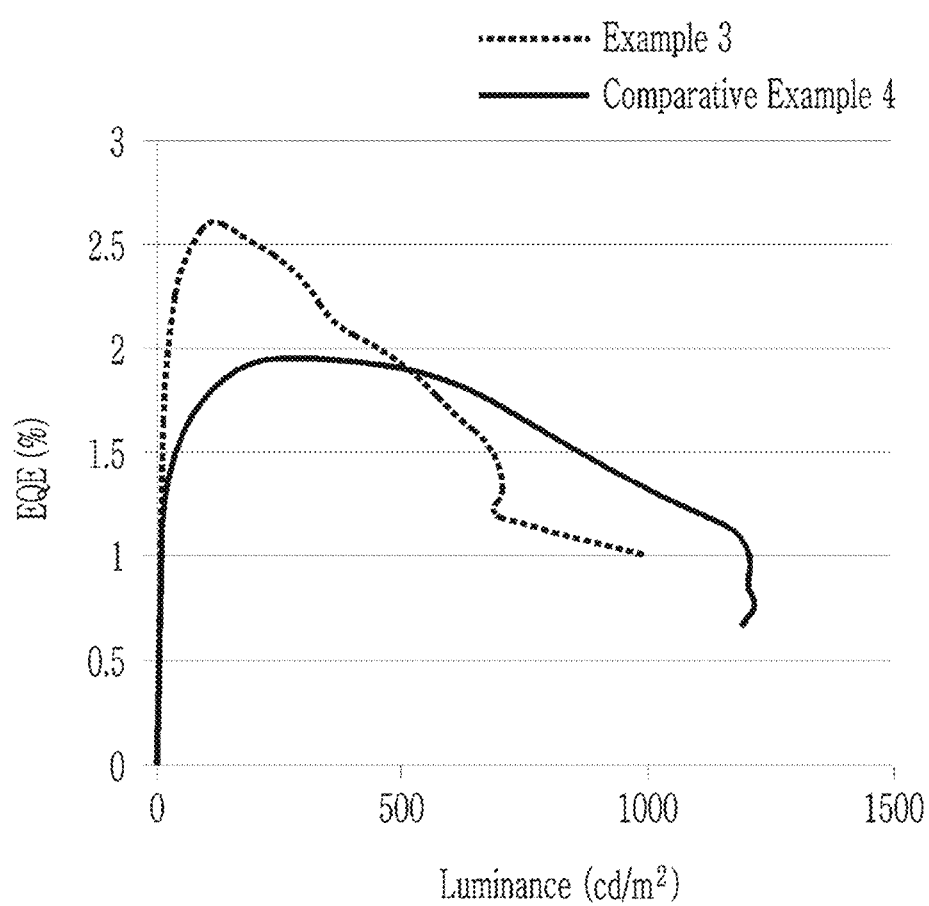
FIG. 12 is a graph of external quantum efficiency (EQE, %) versus luminescence ($cd/m^2$) showing a luminance-external quantum efficiency relationship of the electroluminescent devices according to Example 3 and Comparative Example 4.
Figure 13:
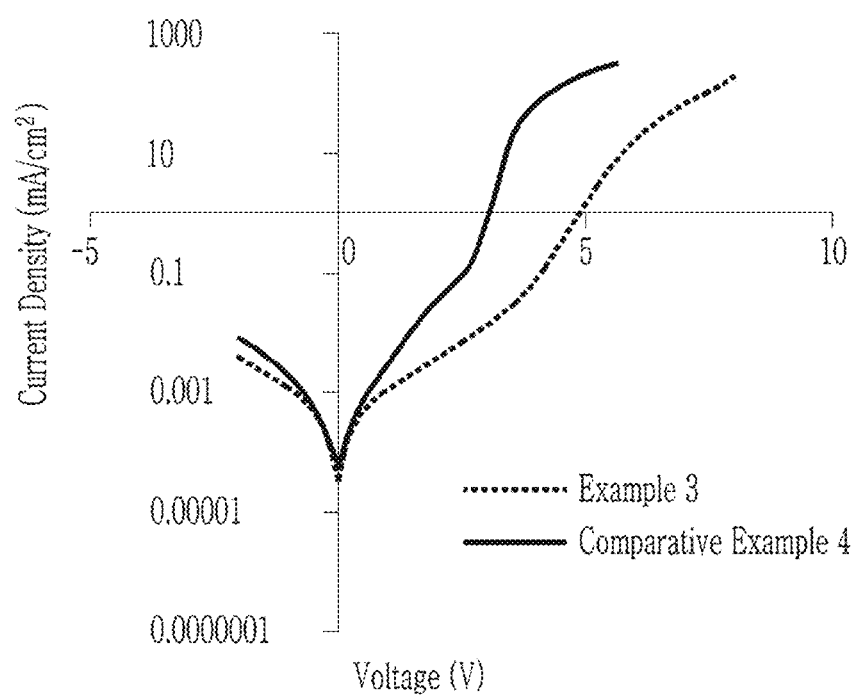
FIG. 13 is a graph of current density ($mA/cm^2$, logarithmic scale) versus Voltage (V) showing a voltage-current density relationship of the electroluminescent devices according to Example 3 and Comparative Example 4.

On the other hand, I-V-L characteristics of the electroluminescent devices of Example 3 and Comparative Example 4 are respectively shown in FIGS. 10 to 12, and J-V characteristics are shown in FIG. 13.

FIGS. 10 to 12 are graphs showing I-V-L characteristics of the electroluminescent devices according to Example 3 and Comparative Example 4; FIG. 10 shows voltage-current density, FIG. 11 shows voltage-luminance, and FIG. 12 shows luminance-external quantum efficiency, respectively.

Referring to FIGS. 10 to 12, Example 3 shows a slightly lower current density at the same voltage and a slightly lower luminance at the same voltage, since the organic layer including the organic compound 1: organic compound 2 blend works as an energy barrier against electrons moving from the Al layer to the ZnO cluster, and also a very high luminance-external quantum efficiency of about 2.6% at a lower luminance of less than or equal to about 500 cd/m$^2$ and particularly, less than or equal to about 100 cd/m$^2$.

FIG. 13 is a voltage-current density graph of the electroluminescent devices according to Example 3 and Comparative Example 4. FIG. 13 is a graph showing the current density in the y-axis on a logarithmic scale.

Referring to FIG. 13, Example 1 further having the organic layer including the organic compound 1: organic compound 2 blend on the surface of the ZnO cluster layer shows an excellent reduction in leakage current compared with Comparative Example 4 having only the ZnO cluster layer without an organic layer.

While this disclosure has been described in connection with what is presently considered to be practical example embodiments, it is to be understood that the bounds of this disclosure are not limited to the disclosed embodiments. On the contrary, it is intended to cover various modifications and equivalent arrangements included within the spirit and scope of the appended claims.

What is claimed is:
1. An electroluminescent device, comprising:
a first electrode and a second electrode facing each other;
an emission layer disposed between the first electrode and the second electrode and comprising a plurality of light emitting particles;
a hole transport layer disposed between the first electrode and the emission layer; and
an electron transport layer disposed between the emission layer and the second electrode,
wherein the electron transport layer comprises:
an inorganic layer disposed on the emission layer, the inorganic layer comprising a plurality of inorganic nanoparticles; and
an organic layer directly disposed on at least a portion of an upper surface of the inorganic layer on a side opposite the emission layer,
wherein the organic layer has an average thickness of about 2 nanometers to about 20 nanometers.
2. The electroluminescent device of claim 1, wherein the organic layer completely covers the upper surface of the inorganic layer between the inorganic layer and the second electrode.

3. The electroluminescent device of claim 1, wherein the organic layer has a lowest unoccupied molecular orbital (LUMO) energy level of about −1.8 electron Volts to about −2.8 electron Volts.

4. The electroluminescent device of claim 1, wherein the organic layer has an electron mobility of about $10^{-3}$ square centimeters per Volt-second to about $10^{-1}$ square centimeters per Volt-second.

5. The electroluminescent device of claim 1, wherein an inorganic nanoparticle of the plurality of inorganic nanoparticles is ZnO, $TiO_2$, $ZrO_2$, $SnO_2$, $WO_3$, $Ta_2O_3$, or a combination thereof.

6. The electroluminescent device of claim 1, wherein an average particle diameter of the plurality of inorganic nanoparticles is less than or equal to about 150 nanometers.

7. The electroluminescent device of claim 1, wherein the inorganic layer is disposed on the emission layer as a cluster layer comprising the plurality of inorganic nanoparticles.

8. The electroluminescent device of claim 7, wherein the cluster layer is disposed directly on the emission layer.

9. The electroluminescent device of claim 7, wherein
an upper surface of the cluster layer comprises a surface region having two or more grains each comprising the inorganic nanoparticles, wherein a grain boundary is formed between adjacent grains, and
the organic layer fills at least a portion of the grain boundary.

10. The electroluminescent device of claim 7, wherein an average thickness of the cluster layer is less than or equal to about 100 nanometers.

11. The electroluminescent device of claim 1, wherein the organic layer comprises an organic semiconductor compound that is a quinolone-based compound, a triazine-based compound, a quinoline-based compound, a triazole-based compound, a naphthalene-based compound, or a combination thereof.

12. The electroluminescent device of claim 11, wherein the organic layer comprises at least two different organic semiconductor compounds.

13. The electroluminescent device of claim 12, wherein
the organic layer comprises a first organic semiconductor compound and a second organic semiconductor compound that are different from each other, and
a weight ratio of the first organic semiconductor compound and the second organic semiconductor compound in the organic layer is about 3:7 to about 7:3.

14. The electroluminescent device of claim 1, wherein the electron transport layer further comprises at least one additional unit comprising an inorganic layer and an organic layer, wherein the inorganic layers and the organic layers in the electron transport layer are alternately stacked.

15. The electroluminescent device of claim 1, wherein the plurality of light emitting particles comprises quantum dots.

16. The electroluminescent device of claim 15, wherein the quantum dots are a Group II-VI compound that does not comprise Cd, a Group III-V compound, a Group IV-VI compound, a Group IV element or compound, a Group I-III-VI compound, a Group I-II-IV-VI compound that does not comprise Cd, or a combination thereof.

17. The electroluminescent device of claim 15, wherein the quantum dots have a core-shell structure.

18. The electroluminescent device of claim 1, wherein the electron transport layer does not have electroluminescence.

19. The electroluminescent device of claim 1, which further comprises an electron injection layer between the second electrode and the electron transport layer, and optionally a carrier blocking layer between the second electrode and the electron injection layer or between the electron injection layer and the electron transport layer.

20. A display device comprising the electroluminescent device of claim 1.

* * * * *